United States Patent [19]

Ipri

[11] 4,072,974
[45] Feb. 7, 1978

[54] SILICON RESISTIVE DEVICE FOR INTEGRATED CIRCUITS

[75] Inventor: Alfred Charles Ipri, Marlton, N.J.

[73] Assignee: RCA Corporation, New York, N.Y.

[21] Appl. No.: 742,852

[22] Filed: Nov. 18, 1976

Related U.S. Application Data

[63] Continuation of Ser. No. 491,115, July 23, 1974, abandoned.

[51] Int. Cl.$^2$ .................. H01L 27/02; H01L 27/12; H01L 29/04
[52] U.S. Cl. .................................... 357/23; 357/42; 357/51; 357/59; 357/49; 307/304
[58] Field of Search ............... 357/23, 54, 42, 59, 357/52, 40, 51, 49; 307/304

[56] References Cited

U.S. PATENT DOCUMENTS

| | | | |
|---|---|---|---|
| 3,739,238 | 6/1973 | Hara | 357/13 |
| 3,781,831 | 12/1973 | Neugebauer | 357/13 |
| 3,950,738 | 4/1976 | Hayashi et al. | 357/23 |
| 3,952,325 | 4/1976 | Beale et al. | 357/23 |

OTHER PUBLICATIONS

"Philips Technical Review," vol. 31, pp. 271-275, 1970.

Primary Examiner—Andrew J. James
Attorney, Agent, or Firm—H. Christoffersen; R. P. Williams; Donald S. Cohen

[57] ABSTRACT

A resistive device for use as a current feedback loop in an integrated CMOS shift register circuit is made of an island of polycrystalline silicon with a sheet resistivity of from $10^6$ to $10^8$ ohms per square. The polycrystalline silicon island has two contacts thereon fashioned in the manner of MOS source and drain contacts and a dummy polycrystalline silicon insulated gate contact thereon. The device structure is designed to be and is fully compatible with CMOS mesa processing. The method for making the device incorporates into the processing steps for CMOS manufacture the formation of polycrystalline silicon islands on the substrate along with monocrystalline silicon islands. In the process, the polycrystalline silicon island is doped, through source and drain mask openings, with impurities of the same conductivity type as that predominating in the polycrystalline silicon island.

4 Claims, 17 Drawing Figures

SILICON RESISTIVE DEVICE FOR INTEGRATED CIRCUITS

This is a continuation of application Ser. No. 491,115, filed July 23, 1974, now abandoned.

This invention relates to semiconductor integrated circuit devices of the type which are made in thin, layerlike bodies or islands of semiconductive material on insulating substrates.

Shift register integrated circuit devices have been realized by making them in silicon islands formed epitaxially on insulating substrates, such as sapphire. These circuits usually employ complementary P and N channel insulated gate field effect transistors formed in separate islands on the substrate. Separate islands which are initially of P type and N type conductivity are required for the N and P channel transistors, respectively. Usually, this structure is achieved by first growing a layer of silicon of one type conductivity, and then etching away portions of the layer to leave islands of one conductivity type and then growing a second layer of silicon of the opposite conductivity type in the spaces between the first island and etching the second layer to form islands of this opposite type conductivity.

In the manufacture of shift registers of the static type wherein CMOS devices are integrated on a single substrate, one particularly recurring problem has been to obtain an integratable resistor for a current feedback loop of the register, which resistor can be made with processing steps compatible with present CMOS/SOS processing technology. Methods which have been used to provide the high resistance current feedback loop have included outboarding a resistor the use of a leaky transistor formed in the CMOS processing steps by increasing the width of the channel region of a particular transistor. The device of the present invention provides numerous advantages over these aforementioned approaches since it is fully compatible with CMOS processing steps and involves merely the addition of two other steps.

Figure 1:
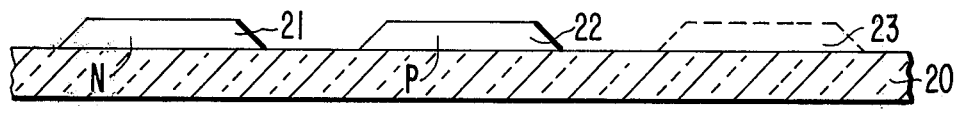
FIGS. 1-9 are sectional views illustrating various steps of the process with which the manufacture of the present polycrystalline silicon resistive device is compatible.

As stated above, the device of the invention was designed to be compatible with present CMOS processing steps and technology. The SOS processing steps may be easily understood by first referring to FIG. 1, wherein there is shown a substrate 20 having thereon semiconductor islands 21 and 22. The substrate 20 is made of sapphire, and the semiconductor islands 21 and 22 are made of silicon. Although not shown, these semiconductor islands are formed by first depositing a layer of silicon on the sapphire substrate 20. As is well known by persons of ordinary skill in this art, the semiconductor islands 21 and 22 are usually formed by a masking technique utilizing photoresist whereby after a silicon dioxide layer is formed on top of the silicon layer, the silicon dioxide is etched according to a pattern selected for the photoresist thereon. Once this is done, by use of a suitable etchant utilizing the silicon dioxide pattern formed on top of the silicon, the silicon islands are etched. Subsequently, the pattern of silicon dioxide still remaining on the silicon islands is removed.

In order to make both P channel and N channel MOS transistors on the same substrate, an addition to the SOS process for the formation of the silicon islands is necessary. Desiring the silicon island 21 to be of an N type and the silicon island 22 to be of a P type, the formation process is as follows: First, a layer of N type silicon is appositioned to the substrate. Sufficiently spaced islands are then etched from this layer. Subsequently, a layer of silicon dioxide is deposited over the N type silicon islands thus formed. Next, P type silicon material is deposited over the entire substrate structure in between the previously formed N type silicon islands. By a photoresist mask and silicon dioxide mask technique, as previously mentioned, the P type silicon islands are formed on the substrate in between the N type silicon islands. (In order to provide the polycrystalline silicon resistive device of the invention, sufficient space is also apportioned on the substrate for the later formation of a number of these devices.) The exposed silicon dioxide on top of the N type silicon island are then removed with a suitable selective etchant. Accordingly, what is produced is the structure shown in FIG. 1, wherein the silicon island 21 is of an N type conductivity and the silicon island 22 is of a P type conductivity, and both are suitably mounted on the substrate 20 such that there is an additional space 23 adequate for the later formation of the polycrystalline silicon resistive device of the invention.

For the purpose of simplicity, the processing steps involved in the formation of MOS transistor devices is presented illustrating first only the formation of a separate N channel transistor and a separate P channel transistor. These steps are shown in FIGS. 1-9 and are explained below. It is to be understood that these devices may be made part of a complementary set.

Figure 2:
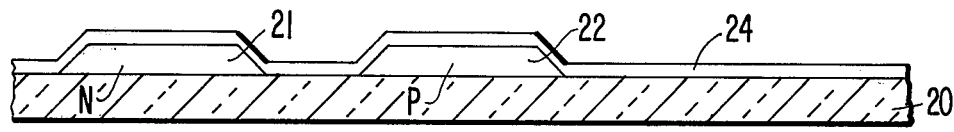
Figure 3:
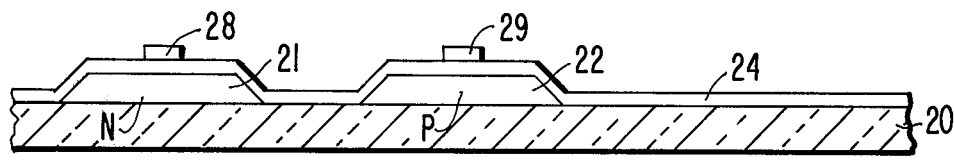
Figure 4:
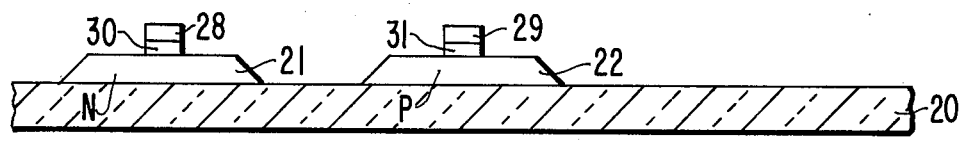

The insulated gate formation step in the MOS process, as shown in FIG. 2, begins with the deposition or growth of a layer 24 of an insulating material such as silicon dioxide or a nitride or a similar material. This layer 24 is deposited over the entire top surface of the silicon-on-sapphire (SOS) structure. The next step is the formation of a polycrystalline silicon gate on top of the region for the channel for each silicon island (See FIG. 3). These gates are centrally located on top of the previously formed layer 24 of insulating material on the silicon islands. A suitable mask is used to define the geometry of these gates. The formations of the polycrystalline silicon gates 28 and 29 for the N type island 21 and for the P type is and 22, respectively, are illustrated in FIG. 3. The gate oxides 30 and 31 (See FIG. 4) are formed by etching the exposed portions of the layer 24 of insulating material.

Figure 5:
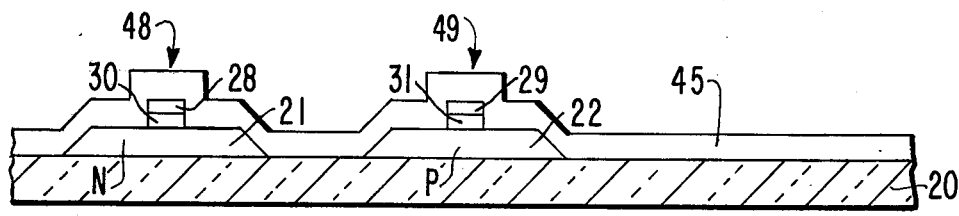
Figure 6:
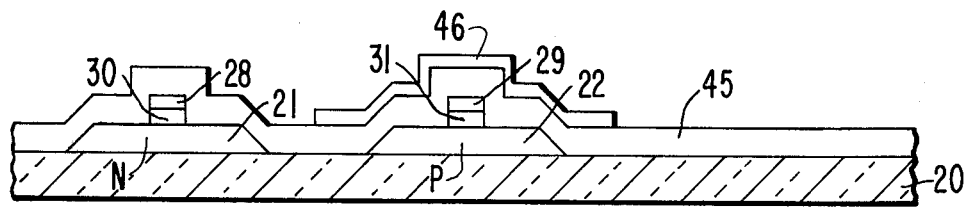
Figure 7:
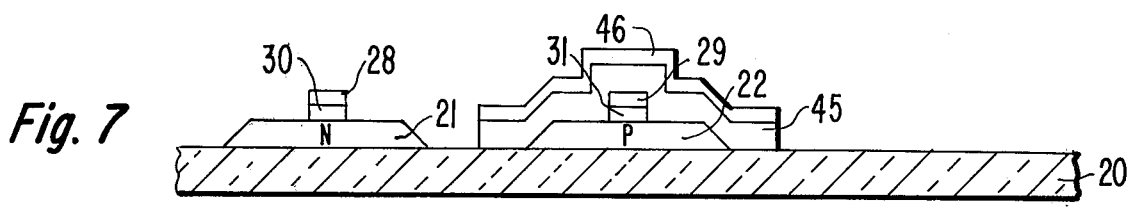
Figure 8:
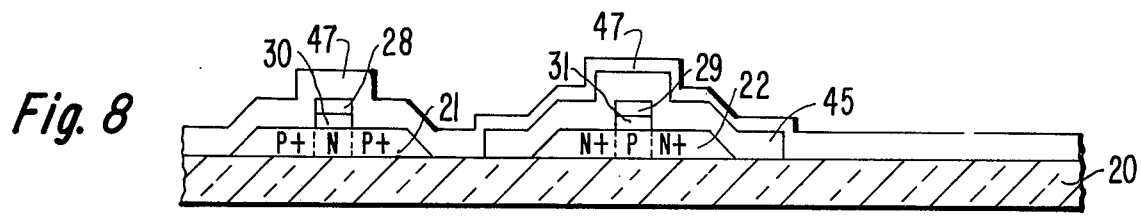
Figure 14:
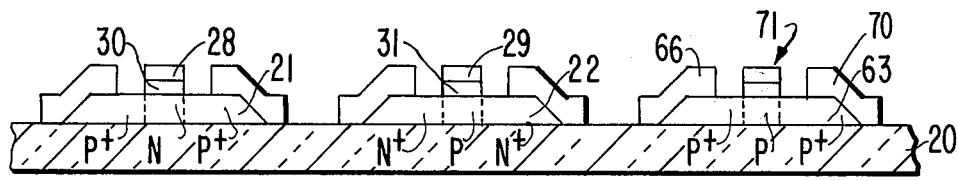
FIG. 14 is a sectional view illustrating a completed N channel MOS transistor, a completed P channel MOS transistor, and a completed polycrystalline silicon resistive device of the invention, all of the same substrate.

A layer 45 of silicon dioxide heavily doped with phosphorus (N+ layer) is next deposited, as shown in FIG. 5, over the entire SOS structure. Since it is not desirable to have the N+ layer 45 of silicon dioxide in contact with the source and drain regions of the P channel structure 48 during diffusion, the structure 49 is masked with a layer of photoresist 46, (See FIG. 6) and the exposed portions of the layer 45 over the P channel structure are etched away. In FIG. 7, the structure is illustrated with the exposed portions of the layer 45 removed. There is shown the source and drain areas of the N type island 21 completely exposed. As illustrated in FIG. 8, a P+ doped oxide layer 47 is deposited over the entire structure and, in particular, on the source and drain areas of the N type semiconductor island 21. This structure is heated in accordance with methods well known to persons of ordinary skill in the art to form PN junctions beneath the gates. The silicon island 21, because the layer 47 is highly doped with boron (Pt-doped oxide layer), is transformed into an island having two P+ type conductivity regions separated by an N type conductivity region or P channel. The silicon island 22 is transformed into a structure having two N+ type conductivity regions separated by a P type conductivity region or N channel. The layers 45 and 47 of doped silicon dioxide may be removed with a suitable silicon dioxide etchant to expose the source and drain areas of the structures so that metal contacts may be formed thereon (See FIG. 14). Alternatively, the layers 45 and 47 may remain with holes 41, 42, 43, and 44 etched through them for the sources and drains (see FIG. 17).

Figure 9:
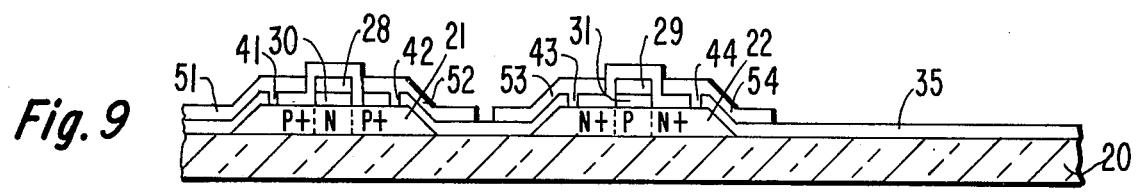

In order to define source and drain holes for the MOS devices, an additional layer 35 of an insulating material may be deposited on all exposed top surfaces of the SOS structures. This is illustrated in FIG. 9, wherein there is shown the layer 35 of, for example, silicon dioxide, deposited on all exposed surfaces of the substrate 20 as well as over the polycrystalline gates 28 and 29, the exposed surfaces of the silicon islands 21 and 22, and the exposed portions of the gate oxides 30 and 31. Next, the source and drain holes for each device are etched through the layer 35. These holes 41, 42, 43, and 44 are illustrated in FIG. 9.

In FIG. 9, metal contacts 51, 52, 53, and 54 are formed, respectively, in the holes 41, 42, 43, and 44 for source and drain contacts. Similarly, metal contacts 101, 102, 103, 104, 105, and 106 are formed in the devices of FIG. 17. The final step in processing is the formation of a metal or other conductive contact connected to tthe polycrystalline silicon gates 28 and 29. Although not shown here, in state-of-the-art devices the exterior conductive contacts for the polycrystalline silicon gates 28 and 29 of FIG. 9 are formed by first etching a hole in the oxide layer 35 directly above a portion of the polycrystalline silicon for the gate which is remote from the channel.

The foregoing paragraphs have evinced the usual processing steps in the formation of an integrated circuit comprised of N channel and P channel MOS transistors.

Figure 10:
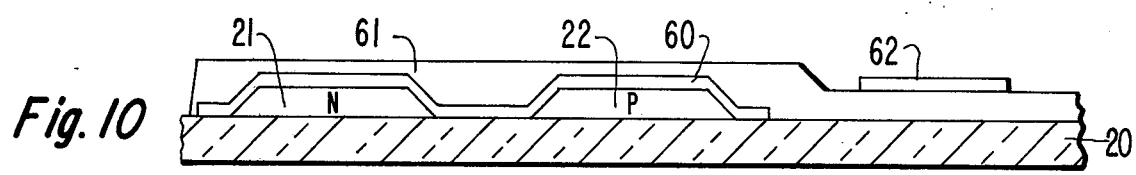
FIGS. 10-12 are sectional views illustrating the additional steps necessary for the manufacture of the resistive device of the invention.
Figure 11:
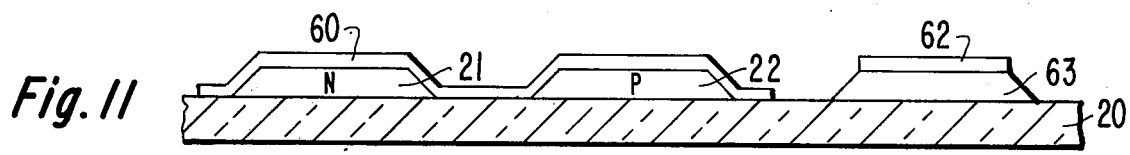
Figure 12:
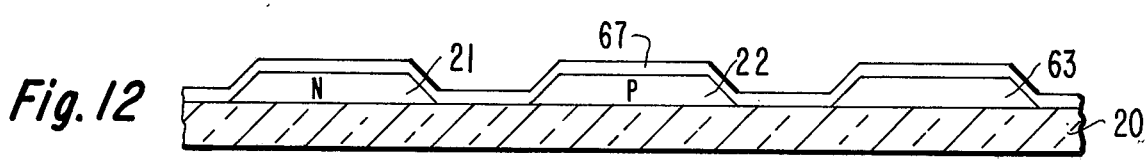
Figure 13:
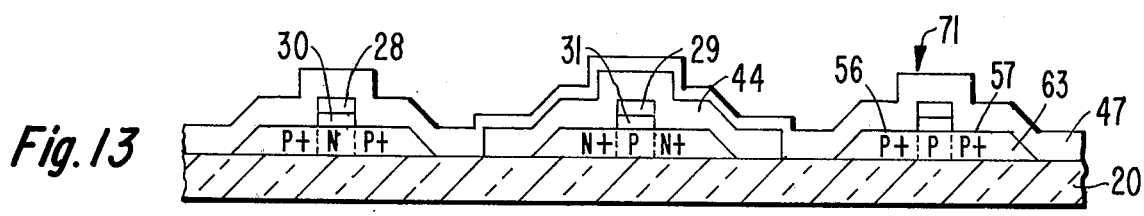
FIG. 13 is a sectional view showing the diffusion of the sources and drains of an N channel MOS device and a P channel MOS device on the same substrate with the polycrystalline silicon resistive device.

Referring now to FIGS. 1 and 10-17 it is shown how, by incorporating a few novel steps into the previous process, a novel polycrystalline silicon resistive device may also be formed on the substrate for later incorporation, as desired, in a suitable integrated circuit along with the N channel and P channel transistor devices. In order to form an island of polycrystalline silicon, in the space 23 of FIG. 1, a layer 61 of polycrystalline silicon is deposited over the entire structure, in a manner as described by Kemlage et al, U.S. Pat. No. 3,698,947, column 3, paragraph 2, as shown in FIG. 10. The silicon islands 21 and 22 are protected by a silicon dioxide coating 60. A silicon dioxide mask 62 is formed over the polycrystalline silicon layer 61 at a site where the polycrystalline silicon island is desired on the substrate 20. The exposed portion of from the layer 61 is etched away, except for the portion protected by the silicon dioxide mask 62 (see FIG. 11). The etching produces the polycrystalline silicon island 63. In FIG. 12, the silicon dioxide mask 62 and the silicon dioxide coating 60 are removed by etching, and the processing is continued with the formation of a layer 67 of silicon dioxide. From this point, processing is continued in the same manner as previously illustrated in FIGS. 2-8. However, because of the introduction of the polycrystalline silicon island 63 into the processing steps instead of the structures as shown in FIG. 8, the formations shown in FIG. 13 are produced. One of these formations is the polycrystalline silicon island 63 of P type conductivity with false source and drain regions of P+ type conductivity separated by a channel of P type conductivity. By doping a high concentration of boron into the source and drain areas 56 and 57 formed for the polycrystalline silicon island 63, the island is transformed into a P+-P-P+ island. As may be observed in FIG. 14, the processing is continued by the removal of the layers 45 and 47 of silicon dioxide (see FIG. 13). Metal contacts 66 and 70 are formed for the resistive device and separated by the false gate structure 71.

Figure 15:
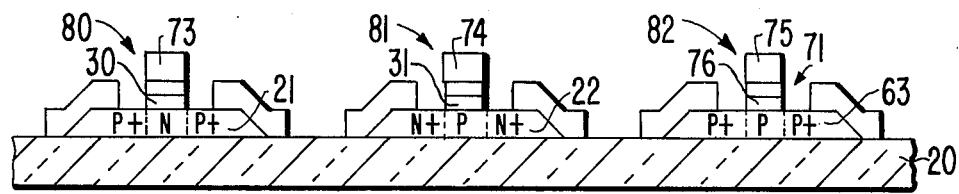
FIG. 15 is a sectional view illustrating the formation of metal gate contacts on top of an insulating layer formed on the polycrystalline silicon gate contacts.
Figure 16:
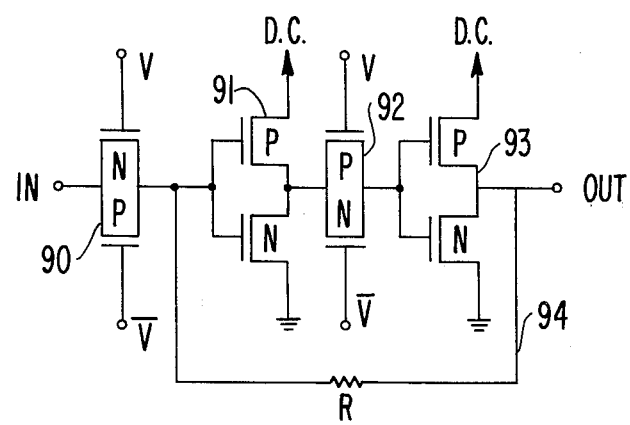
FIG. 16 is a circuit diagram of a shift register incorporating a resistive device as a current feedback loop.
Figure 17:
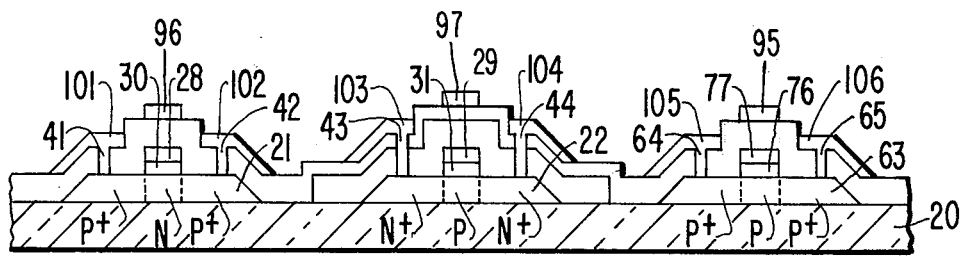
FIG. 17 is a sectional view illustrating an alternate method of forming source and drain contacts directly through previously deposited N-doped and P-doped oxide diffusion layers.

Another new device is a gated polycrystalline silicon resistor. An example of this device is illustrated in FIG. 15 by the formation of an isolated metal or conductive contact 75, similar to the transistor contacts 73, and 74, on the polycrystalline silicon resistor 82. The technique, which is fully compatible with the outlined polycrystalline silicon MOS/SOS process, produces devices with a gate oxide thickness which is determined by the thickness of the oxide 76 which supports the gate 77. An even greater thickness of the gate oxide may be produced by permitting the doped oxide layers 45 and 47 (see FIG. 13) to remain and simply opening the source and drain holes 41, 42, 43, 44, 64, and 65 by etching through these layers above these holes contacts 101, 102, 103, 104, 105, and 106, as shown in FIG. 17. Because of the thick effective oxide under the gates 96, 97, and 98 (see FIG. 17), these devices have a minimum capacitance value from gate to substrate. This maximizes the speed of the devices while minimizing power dissipation. Accordingly, each of the devices illustrated in FIGS. 15 or 17 is suitable for use in a current feedback loop for a CMOS shift register integrated circuit, as illustrated in FIG. 16. Hence, transistor 81, or the polycrystalline silicon resistor 82 of FIG. 15 or the respective devices 83, 84, and 85 of FIG. 17 may be used for the resistive element R of FIG. 16.

The circuit shown in FIG. 16 is a standard shift register cell comprised of a serial connection of a CMOS transmission gate 90, a CMOS inverter 91, a CMOS transmission gate 92, and a CMOS inverter 93. Clock signal voltages V and $\overline{V}$ are applied respectively to the N channel gate and the P channel gate of the transmission gate device 90. For the transmission gate device 92, the clock voltage pulses to the gates of the channels are reversed. By utilizing either the polycrystalline silicon resistive device 82 or 85, or either of the high threshold transistors 80, 81, or 83, 84 (See FIGS. 15 and 17) for the resistor R in the feedback loop 94 of the circuit of FIG. 16, the dynamic shift register is converted into a static shift register. The circuit of FIG. 16 with the feedback loop 94 added can hold data indefinitely.

Typically, the epitaxial layer of silicon is 0.6 μm thick. The substance is a single crystal ($1\bar{1}02$) of sapphire doped to a concentration of 1 to $2 \times 10^{15}$ atoms/cm$^3$. The layer of polycrystalline silicon for the resistive device is typically 0.5 μm thick and is typically doped to concentration of 1.0 to $3.0 \times 10^{17}$ atoms/cm$^3$.

For carrier concentrations in the polycrystalline silicon layer greater than approximately $4.0 \times 10^{17}$ atoms/cm$^3$, the mobility remains constant and the sheet resistance varies linearly with concentration.

For a shift register cell of P channel and N channel transistors with 0.2 μm channel lengths and 0.2 μm channel widths and a 25 MHz clock frequency, R must be approximately $10^8$ ohms to permit the output of the output inverter to drop below 0.6v with less than 2.4v on the clock terminal.

Voltage applied to the gate terminal of the resistive device from the clock signal may be used to minimize excess current flow. The resistance of the polycrystalline silicon device decreases by about 80 percent when the gate is on.

What is claimed is:

1. In an integrated circuit of the type comprising a shift register cell comprised of a first complementary symmetry metal-oxide-semiconductor transmission gate, a first complementary symmetry metal-oxide-semiconductor inverter having a common gate electrode connected to the output of the first gate, a second complementary symmetry metal-oxide-semiconductor transmission gate having an input connected to the output of the first inverter and a second complementary symmetry metal-oxide-semiconductor inverter having a common gate electrode connected to the output of the second complementary symmetry metal-oxide-semiconductor gate, the improvement comprising a resistive device comprised of an island of polycrystalline silicon having three regions of the same conductivity type, two of the regions having a high impurity concentration with conductive contacts connected thereto, the other regions separating the first mentioned regions and having a moderate impurity concentration, the resistive device being connected between the output of the second complementary sgymmetry metal-oxide-semiconductor inverter and the input of the first complementary symmetry metal-oxide-semiconductor inverter.

2. A resistive device comprising mesa semiconducting means for providing high ohmic electrical resistance, said means comprising two doped regions of a conductivity type, at least two laterally spaced conductive contacts connected respectively to the two regions, said semiconducting means further comprising a channel region of the same conductivity type with less doping concentration, the channel region separating the first said two regions, an insulating means locating adjacent the channel region, a false gate adjacent the insulating means, the false gate being located above the channel region, and an insulating single crystal substrate adjacent the semiconducting means and supporting the semiconducting means, wherein said semiconducting means is comprised of an island of polycrystalline silicon, wherein the first said two regions have a high impurity concentration, and wherein the channel region has a moderate impurity concentration.

3. In a silicon-on-sapphire integrated circuit of the type comprising at least one field effect transistor having a source and a drain separate by a channel, a source contact connected to the source, a drain contact connected to the drain, and a gate insulated from and spaced above the channel, the improvement comprising:

a resistor device comprising an island of polycrystalline silicon having three regions of the same conductivity type, two of the regions having a high impurity concentration with conductive contacts connected thereto, the other region separating the first mentioned regions and having moderate impurity concentrations, the resistor device being connected to the field effect transistor.

4. In a silicon-on-sapphire integrated circuit of the type comprising at least one field effect transistor having a source and a drain separated by a channel, a source contact connected to the source, a drain contact connected to the drain, and a gate insulated from and spaced above the channel, the improvement comprising:

mesa semiconducting means for providing high ohmic electrical resistance, said means comprising two doped regions of a conductivity type, at least two laterally spaced conductive contacts connected respectively to the two regions, said semiconducting means further comprising a channel region of the same conductivity type with less doping concentration, the channel region separating the first said two regions, and insulating means located adjacent the channel region, a false gate adjacent the insulating means, the false gate being located above the channel region, and an insulating single crystal substrate adjacent the semiconducting means and supporting the semiconducting means, wherein said semiconducting means is comprised of an island of polycrystalline silicon, wherein the first said two regions have a high impurity concentration and the channel region has a moderate impurity concentration, wherein the false gate comprises a first layer of an insulating maferial on said island, a second layer of polycrystalline silicon on the first layer, and a third layer of an insulating material above the first and second layers.

* * * * *

UNITED STATES PATENT OFFICE
CERTIFICATE OF CORRECTION

Patent No. 4,072,974                Dated    February 7, 1978

Inventor(s) Alfred Charles Ipri

It is certified that error appears in the above-identified patent and that said Letters Patent are hereby corrected as shown below:

| | |
|---|---|
| Col. 1, line 56: | after "all" "of" should be--on-- |
| Col. 2, line 37: | after "island" insert--and the exposed silicon dioxide masking the P type silicon island-- |
| Col. 3, line 19: | "the" should be--this-- |
| Col. 3, line 21: | "Pt" should be--P+-- |
| Col. 4, line 9: | delete--from-- |
| Col. 4, line 28: | after "island" insert--as shown in FIG. 13.-- |
| Col. 4, line 46: | after "holes" insert--and adding-- |

UNITED STATES PATENT OFFICE
CERTIFICATE OF CORRECTION

Patent No. 4,072,974  Dated February 7, 1978

Inventor(s) Alfred Charles Ipri

It is certified that error appears in the above-identified patent and that said Letters Patent are hereby corrected as shown below:

Col. 5, line 48:   "sgymmetry" should be --symmetry--

Col. 6, line 1:    "locating" should be --located--

Col. 6, line 13:   "separate" should be --separated--

Col. 6, line 53:   "maferial" should be --material--

Signed and Sealed this

Fourth Day of July 1978

[SEAL]

Attest:

RUTH C. MASON
*Attesting Officer*

DONALD W. BANNER
*Commissioner of Patents and Trademarks*